(12) United States Patent
Song et al.

(10) Patent No.: US 9,831,461 B2
(45) Date of Patent: Nov. 28, 2017

(54) DISPLAY SUBSTRATE AND MANUFACTURING METHOD THEREOF, DISPLAY PANEL AND MASK

(71) Applicant: BOE TECHNOLOGY GROUP CO., LTD., Beijing (CN)

(72) Inventors: Young Suk Song, Beijing (CN); Seong Yeol Yoo, Beijing (CN); Seung Jin Choi, Beijing (CN); Hee Cheol Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/038,093

(22) PCT Filed: Nov. 18, 2015

(86) PCT No.: PCT/CN2015/094860
§ 371 (c)(1),
(2) Date: May 20, 2016

(87) PCT Pub. No.: WO2016/107323
PCT Pub. Date: Jul. 7, 2016

(65) Prior Publication Data
US 2016/0365532 A1    Dec. 15, 2016

(30) Foreign Application Priority Data
Dec. 30, 2014    (CN) .......................... 2014 1 0841697

(51) Int. Cl.
*H01L 51/52*    (2006.01)
*C23C 14/04*    (2006.01)
(Continued)

(52) U.S. Cl.
CPC .......... *H01L 51/5212* (2013.01); *C23C 14/04* (2013.01); *H01L 27/32* (2013.01);
(Continued)

(58) Field of Classification Search
CPC ..... C23C 14/04; H01L 27/32; H01L 27/3249; H01L 51/0011; H01L 51/5212; H01L 51/5228; H01L 51/56
See application file for complete search history.

(56) References Cited

U.S. PATENT DOCUMENTS

2006/0017375 A1    1/2006  Noguchi et al.
2007/0029929 A1    2/2007  Nakamura et al.
(Continued)

FOREIGN PATENT DOCUMENTS

CN    103066212 A    4/2013
CN    103545345 A    1/2014
(Continued)

OTHER PUBLICATIONS

International Search Report dated Feb. 1, 2016 corresponding to International application No. PCT/CN2015/094860.
(Continued)

*Primary Examiner* — Allan R Wilson
(74) *Attorney, Agent, or Firm* — Nath, Goldberg & Meyer; Joshua B. Goldberg

(57) ABSTRACT

The present invention provides a display substrate, which includes an anode layer, a cathode layer and a luminous layer that is provided between the anode layer and the cathode layer, the anode layer including a plurality of anodes and the luminous layer including a plurality of luminous regions, wherein the display substrate further includes at least one assisting electrode, the assisting electrode being insulated and spaced from the anode, and the assisting electrode contacting with the cathode layer in parallel, such that a total resistance of the assisting electrode and the cathode layer connected in parallel is smaller than a resistance of the cathode layer alone. The IR drop in the cathode of the display substrate provided by the present invention is relatively small, such that loss of electric signals is relatively (Continued)

small in the cathode layer and the assisting electrode, thereby obtaining a relatively higher image quality.

12 Claims, 3 Drawing Sheets

(51) Int. Cl.
  *H01L 51/56*  (2006.01)
  *H01L 27/32*  (2006.01)
  *H01L 51/00*  (2006.01)

(52) U.S. Cl.
  CPC ...... *H01L 27/3246* (2013.01); *H01L 51/0011* (2013.01); *H01L 51/5228* (2013.01); *H01L 51/56* (2013.01)

(56) References Cited

U.S. PATENT DOCUMENTS

| | | | | |
|---|---|---|---|---|
| 2008/0191603 A1* | 8/2008 | Kubota | ............... | H01L 51/5228 313/498 |
| 2008/0197778 A1* | 8/2008 | Kubota | ............... | H01L 27/3258 315/73 |
| 2012/0153831 A1 | 6/2012 | Kasai | | |
| 2015/0008398 A1* | 1/2015 | Lee | ..................... | H01L 51/5212 257/40 |
| 2015/0021560 A1* | 1/2015 | Jeong | ...................... | H01L 51/56 257/40 |
| 2015/0144922 A1* | 5/2015 | Moon | .................. | H01L 27/3279 257/40 |
| 2016/0141545 A1* | 5/2016 | Kim | ...................... | G09G 3/3225 257/40 |

FOREIGN PATENT DOCUMENTS

| | | |
|---|---|---|
| CN | 104022139 A | 9/2014 |
| CN | 204179115 U | 2/2015 |
| CN | 104393188 A | 3/2015 |
| CN | 204257650 U | 4/2015 |
| CN | 104659063 A | 5/2015 |
| WO | 2013/179361 A1 | 12/2013 |

OTHER PUBLICATIONS

Written Opinion of the International Searching Authority dated Feb. 1, 2016 corresponding to International application No. PCT/CN2015/094860.

Office Action dated Mar. 1, 2017 issued in corresponding Chinese Application No. 201410841697.5.

The Second Office Action dated Jul. 3, 2017 corresponding to Chinese application No. 201410841697.5.

\* cited by examiner

DISPLAY SUBSTRATE AND MANUFACTURING METHOD THEREOF, DISPLAY PANEL AND MASK

This is a National Phase Application filed under 35 U.S.C. 371 as a national stage of PCT/CN2015/094860, filed Nov. 18, 2015, an application claiming the benefit of Chinese Application No. 201410841697.5, filed Dec. 30, 2014, the content of each of which is hereby incorporated by reference in its entirety.

FIELD OF THE INVENTION

The present invention relates to the field of organic light emitting diode (OLED) display technology, and particularly, to a display substrate, a display panel including the display substrate, a manufacturing method of the display substrate and a mask that is used in the manufacturing method.

BACKGROUND OF THE INVENTION

A display substrate of an OLED display panel includes a thin film transistor array and a luminous element array, wherein the thin film transistor array includes a plurality of thin film transistors, and the luminous element array includes an anode layer, a cathode layer and a luminous layer that is provided between the anode layer and the cathode layer. The anode layer includes a plurality of anodes, and the anodes are connected with drains of the thin film transistors in a one-to-one correspondence.

The cathode layer is generally formed by sputtering a transparent material such as Indium Tin Oxide (ITO) or evaporating a transparent material having a good reflectivity above the luminous layer. In a case where the cathode layer is formed by sputtering ITO, the luminous layer is easily to be damaged, and luminous efficiency of the OLED display panel is reduced.

As described above, the cathode layer may also be formed by evaporating a transparent material having a good reflectivity. However, the cathode layer formed in such manner often has a large resistance, and a large IR drop will be present when displaying, eventually degrading the image quality of the display panel.

Thus, how to prevent the image quality of the display panel from being degraded due to the large IR drop in the cathode becomes a technical problem having to be solved urgently.

SUMMARY OF THE INVENTION

An object of the present invention is to provide a display substrate, a display panel including the display substrate, a manufacturing method of the display substrate and a mask used in the manufacturing method for solving the problem of poor image quality of the display panel during display due to the large IR drop in the cathode.

To achieve the above object, as an aspect of the present invention, there is provided a display substrate, which includes an anode layer, a cathode layer and a luminous layer that is provided between the anode layer and the cathode layer, the anode layer including a plurality of anodes and the luminous layer including a plurality of luminous regions, wherein the display substrate further includes at least one assisting electrode, the assisting electrode being insulated and spaced from the anodes, and the assisting electrode contacting the cathode layer in parallel, such that a total resistance of the assisting electrode and the cathode layer connected in parallel is smaller than a resistance of the cathode layer alone.

Preferably, the assisting electrode and the anode layer are provided in a same layer.

Preferably, the display substrate further includes a spacer, insulation gaps are respectively formed at two sides of the assisting electrode, a portion of the spacer being provided within the corresponding insulation gap and another portion of the spacer protruding from the anode layer, so as to space and insulate the assisting electrode and the anode.

Preferably, there are a plurality pairs of spacers, and the plurality pairs of spacers divide the display substrate into a plurality of anode regions and a plurality of assisting electrode regions, each of the anode regions being provided therein with at least one anode and a luminous region, each of the assisting electrode regions being provided therein with the assisting electrode, the assisting electrode region being provided around the anode region, a width of the assisting electrode region being smaller than a width of the anode region, a portion of the cathode layer being located within a gap between a pair of the spacers in the assisting electrode region so as to electrically connect the cathode layer and the assisting electrode.

Preferably, the spacer includes a row spacer extending horizontally along the display substrate and a column spacer extending longitudinally along the display substrate.

Preferably, shapes of the luminous regions formed in two anode regions at two sides of the assisting electrode are different.

Preferably, the display substrate further includes spacers that divide the display substrate into a plurality of pixel units, a portion of the spacer penetrating through the anode layer and another portion of the spacer being located above the anode layer.

Preferably, each of the assisting electrodes corresponds to one spacer, the assisting electrodes being connected in a mesh shape, insulation gaps being respectively formed at two sides of each of the assisting electrodes, each spacer including insertion parts being respectively provided within the insulation gaps at two sides of the corresponding assisting electrode and a connection part for connecting two insertion parts, the connection part of at least one spacer being provided with a via for exposing the assisting electrode, the cathode layer being connected with the assisting electrode in parallel through the via.

Preferably, the spacers define a plurality of regions and shapes of two adjacent regions are different, the luminous region being formed within the region.

As another aspect of the present invention, there is provided a display panel, which includes the above display substrate provided by the present invention.

As yet another aspect of the present invention, there is provided a manufacturing method of a display substrate, which includes the following step of:
  forming a luminous element array, and the step of forming the luminous element array includes:
    forming an anode layer and at least one assisting electrode, the anode layer including a plurality of anodes, the assisting electrode being insulated and spaced from the anodes;
    forming a luminous layer, the luminous layer including a plurality of luminous regions; and
    forming a cathode layer, the cathode layer contacting the assisting electrode in parallel, such that a total resistance of the assisting electrode and the cathode layer connected in parallel is smaller than a resistance of the cathode layer alone.

Preferably, the step of forming the anode layer and the at least one assisting electrode includes providing the anode layer and the at least one assisting electrode in a same layer.

Preferably, the step of forming the anode layer and the at least one assisting electrode includes steps of:
  forming an anode material layer; and
  forming a plurality of anode regions and a plurality of assisting electrode regions from the anode material layer, an insulation gap being formed between the assisting electrode region and the anode region adjacent to the assisting electrode region, at least one anode being included within each anode region, and the plurality of assisting electrodes being connected in a mesh shape.

Between the step of forming the anode layer and the at least one assisting electrode and the step of forming the luminous layer, the manufacturing method further includes a step of:
  forming a spacer within each insulation gap, a portion of the spacer being provided within the insulation gap and another portion of the spacer protruding from the anode layer; and
  the step of forming the cathode layer includes depositing a material for forming the cathode layer within a gap between a pair of spacers, which have the assisting electrode formed therebtween, such that the cathode layer connects with the assisting electrode in parallel.

Preferably, the step of forming the luminous layer includes steps of:
  disposing a mask above a base substrate formed thereon with the anode layer, wherein the mask includes a plurality of opening parts corresponding to the plurality of anode regions and a shielding part corresponding to the at least one assisting electrode; and
  evaporating a material used for forming the luminous layer, so as to form the plurality of luminous regions above the plurality of anode regions by deposition.

Preferably, the plurality of anode regions are arranged in rows and columns.

Preferably, shapes of two anode regions at two sides of the assisting electrode are different, so that the luminous regions deposited within the two anode regions are different.

Preferably, the step of forming the anode layer and the at least one assisting electrode includes steps of:
  forming an anode material layer; and
  forming a plurality of insulation gaps penetrating through the anode material layer in the anode material layer, so as to divide the anode material layer into a plurality of pixel units.

Between the step of forming the anode layer and the at least one assisting electrode and the step of forming the luminous layer, the manufacturing method further includes a step of:
  forming a pattern including a spacer, a portion of the spacer being located within the insulation gap and the other portion of the spacer being located above the anode layer.

Preferably, at least one of the plurality of insulation gaps includes a first gap and a second gap, and the assisting electrode is formed between the first gap and the second gap. The spacer corresponding to the assisting electrode includes insertion parts that are respectively provided in the insulation gaps at two sides of the assisting electrode and a connection part for connecting two insertion parts;

the manufacturing method further includes a step of forming a via for exposing the assisting electrode in the connection part between the step of forming the luminous layer and the step of forming the cathode layer; and the step of forming the cathode layer includes depositing a material used for forming the cathode layer in the via, such that the cathode layer connects with the assisting electrode in parallel.

Preferably, the step of forming the luminous layer includes:
  disposing a mask above a base substrate formed thereon with the anode layer, wherein the mask includes a plurality of opening parts and a plurality of shielding parts for spacing the plurality of opening parts, the shielding part corresponds to the assisting electrode; and
  evaporating a material used for forming the luminous layer, so as to form the luminous region above a position corresponding to the opening part by deposition.

Preferably, the spacers define a plurality of regions and the shapes of two adjacent regions are different, the luminous region being formed within the region.

As still another aspect of the present invention, there is provided a mask, which is used in the above manufacturing method provided by the present invention, wherein the mask includes a plurality of opening parts and a shielding part corresponding to the at least one assisting electrode, the shielding part being used for spacing the adjacent opening parts.

When a display panel including the display substrate provided by the present invention operates, an electric current will flow to the assisting electrode simultaneously when the electric current is injected into the cathode layer. As the assisting electrode and the cathode layer are connected in parallel to form a combined element, a resistance of which is smaller than that of the cathode layer alone, compared to the display substrate without the assisting electrode, the IR drop in the cathode of the display substrate provided by the present invention is relatively small, such that loss of electric signals is relatively small in the cathode layer and the assisting electrode, thereby obtaining a relatively higher image quality.

BRIEF DESCRIPTION OF THE DRAWINGS

Accompanying drawings are used for providing further understandings of the present invention, constitute as a part of the specification, and are used to explain the present invention in conjunction with the following specific implementations, but not to restrict the present invention. In the drawings.

DETAILED DESCRIPTION OF THE EMBODIMENTS

Next, specific implementations of the present invention will be described in details in conjunction with the accompanying drawings. It should be understood that the specific implementations described herein are merely used for explaining and illustrating the present invention, rather than restricting the present invention.

Figure 5:
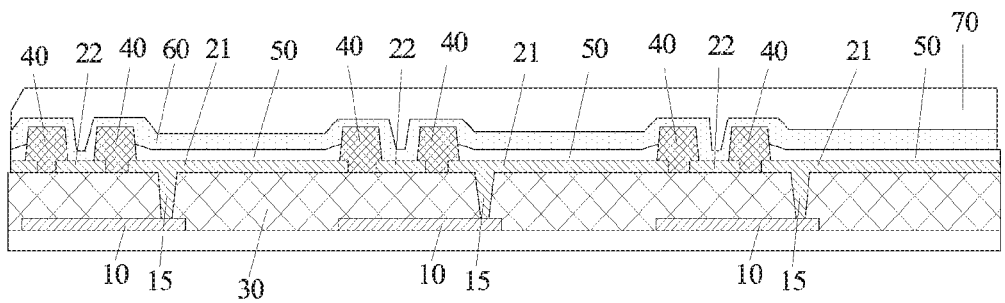
FIG. 5 is a schematic diagram of the substrate after encapsulation.

According to an aspect of the present invention, as shown in FIG. 5, there is provided a display substrate, which includes an anode layer, a cathode layer 60 and a luminous layer that is provided between the anode layer and the cathode layer 60, the anode layer including a plurality of anodes 21 and the luminous layer including a plurality of luminous regions 50, wherein the anode layer further includes at least one assisting electrode 22, the assisting electrode 22 being insulated and spaced from the anodes 21, and the assisting electrode 22 contacting the cathode layer 60 in parallel, such that a total resistance of the assisting electrode 22 and the cathode layer 60 connected in parallel is smaller than a resistance of the cathode layer 60 alone.

When an electric current is injected into the cathode layer 60, the electric current will flow into the assisting electrode 22 simultaneously. As the assisting electrode 22 and the cathode layer 60 are connected in parallel to form a combined element, a resistance of which is smaller than that of the cathode layer 60 alone, compared to the display substrate without the assisting electrode 22, the IR drop in the cathode of the display substrate provided by the present invention is relatively small, such that loss of electric signals is relatively small in the cathode layer 60 and the assisting electrode 22, thereby obtaining a relatively higher image quality.

It should be noted that there is provided the luminous region 50 that is formed by a material used for forming the luminous layer above each anode 21, but the material used for forming the luminous layer is not provided above the assisting electrode 22.

In the present invention, the cathode layer 60 may contact the assisting electrode 22 in parallel through a contact via, or the cathode layer 60 may contact the assisting electrode 22 in parallel in other manners. Moreover, in the present invention, the position for arranging the assisting electrode 22 is not specifically limited, as long as the assisting electrode 22 is provided at a position that will not affect normal display of a display panel.

Those skilled in the art should be understood that the anode layer, the luminous layer and the cathode layer form a luminous element array, which includes a plurality of luminous elements. In other words, anodes of the plurality of luminous elements form the anode layer, luminous regions of the plurality of luminous elements form the luminous layer, and cathodes of the plurality of luminous elements form the cathode layer. The display substrate further includes a thin film transistor array that is provided below the luminous element array, and the thin film transistors in the thin film transistor array form a pixel circuit, which is used for driving the luminous elements to emit light. The thin film transistor array includes therein a plurality of drive thin film transistors 10, each of which corresponds to one luminous element, and the anode of the luminous element is connected with a drain of the drive thin film transistor 10 through a via.

In the present invention, the number of the assisting electrodes 22 is not specifically limited. For example, there may be provided with one assisting electrode 22, or there may be provided with a plurality of assisting electrodes 22. In a case where one assisting electrode 22 is provided, the one assisting electrode 22 may be an integral assisting electrode having a mesh shape, which is provided at edges of pixels.

In the present invention, there is no specific requirement for the relative position relationship between the assisting electrode 22 and the anode 21, as long as the assisting electrode 22 and the anode 21 can be provided insulating and spacing from each other. For example, the assisting electrode 22 may be provided above the anode 21 with an insulation layer provided therebetween, or as a preferred implementation of the present invention, the assisting electrode 22 may be provided in a same layer as the anode layer. The advantage of providing the assisting electrode 22 in the same layer as the anode layer is that the anode 21 and the assisting electrode 22 can be formed simultaneously by a single patterning process, so that the manufacturing process of the display substrate is simplified, and the difficulty of manufacturing the display substrate is lowered. The details of manufacturing the display substrate will be described later, and will not be described herein. It is easily to be understood that the assisting electrode 22 and the anode 21 are made of a same material. The formed structure of the anode layer may be two ITO layers with a material having a good reflectivity sandwiched therebetween, such as any of aluminum, silver, gold, titanium, molybdenum, or an alloy of any of them. Another advantage of providing the assisting electrode 22 and the anode 21 in the same layer is that the reflectivity can be improved, which in turn improves the brightness of the display panel.

Figure 1:
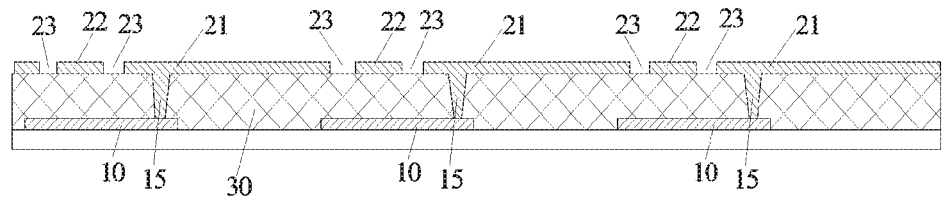
FIG. 1 is a schematic diagram of a substrate formed with an anode layer.

When the assisting electrode 22 and the anode layer are provided in the same layer, the assisting electrode 22 and the anode 21 are provided insulating and spacing from each other. For example, an insulation gap 23 may be provided between the assisting electrode 22 and the anode 21, as shown in FIG. 1. It is easily to be understood that the material used for forming the luminous layer is not provided within the insulation gap as well.

As a preferred implementation of the present invention, the display substrate may further include a spacer 40 for insulating and spacing the assisting electrode 22 and the anode 21. The spacer 40 can ensure that the assisting electrode 22 and the anode 21 are reliably insulated and spaced. In the present invention, the shape of the spacer 40 is not specifically limited, as long as it can insulate and space the assisting electrode 22 and the anode 21. For example, the insulation gaps 23 are respectively formed at two sides of each assisting electrode 22, and each of the insulation gaps 23 is provided therein with the spacer 40. A portion of the spacer 40 is provided within the corresponding insulation gap 23, and another portion of the spacer 40 protrudes from the anode layer, such that the assisting electrode 22 and the anode 21 adjacent thereto are insulated and spaced from each other.

As described above, the assisting electrode 22 should be arranged at a position that will not affect light emitted from the display panel. For example, the assisting electrode 22 may be provided around the anode 21. Accordingly, a plurality pairs of spacers 40 are provided, and the plurality pairs of spacers 40 divide the display substrate into a plurality of anode regions and a plurality of assisting electrode regions, each of the anode regions being provided therein with at least one anode 21 and a luminous region 50 formed from the material used for forming the luminous layer, each of the assisting electrode regions being provided therein with the assisting electrode 22, the assisting electrode region being provided around the anode region. In order to make the display panel have a higher brightness, preferably, a width of the assisting electrode region is smaller than a width of the anode region. It is easily to be understood that the anode 21 is provided within the anode region, and the assisting electrode 22 and the spacer 40 are provided within the assisting electrode region. A portion of the cathode layer 60 is located within the assisting electrode region between a pair of the spacers 40, so as to electrically connect the cathode layer 60 and the assisting electrode 22.

In the present invention, the number of the anodes in each anode region is not limited. For example, a plurality of anodes may be provided within each anode region, or one anode may be provided within each anode region. It should be understood that when a plurality of anodes are provided within each anode region, the plurality of anodes in the same anode region are insulated and spaced from each other through pixel defining elements.

Figure 6:
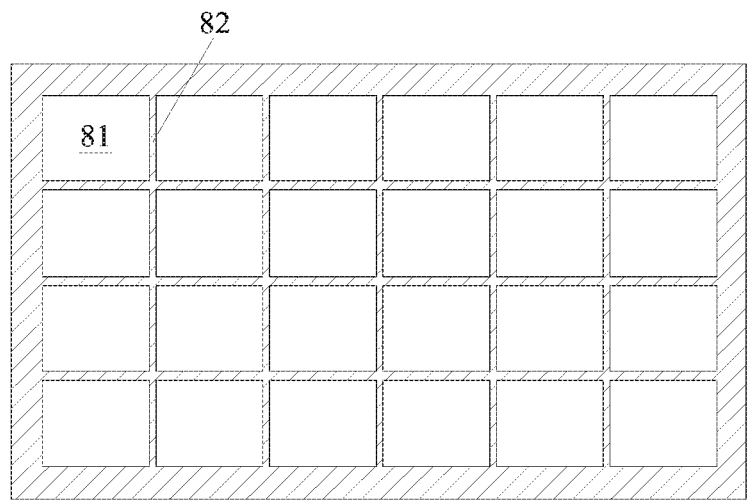
FIG. 6 is a schematic diagram of a mask that is used when forming a luminous layer according to an implementation.

As a specific implementation of the present invention, the spacer may include a row spacer extending horizontally along the display substrate and a column spacer extending longitudinally along the display substrate. FIG. 6 shows a mask for forming the display substrate according to the implementation in a case where the luminous layer is made of a white-light material. As shown in FIG. 6, the mask includes opening parts 81 and shielding parts 82. The opening part 81 corresponds to the anode region and the shielding part 82 corresponds to the assisting electrode region. From that, it can be seen that the anode region may be of a rectangular shape, and the assisting electrode region may be of a mesh shape. The row spacer is formed in a region corresponding to the shielding part extending in a direction from left to right in FIG. 6, and the column spacer is formed in a region corresponding to the shielding part extending in a direction from up to down in FIG. 6

The mask shown in FIG. 6 is of a regular shape, and in a display substrate formed by using the mask, the shapes of two anode regions at two sides of any assisting electrode 22 are identical. That is, the shapes of two luminous regions at two sides of the assisting electrode are identical. The advantages of such mask are that the manufacturing process is simple and the cost is low.

Figure 7:
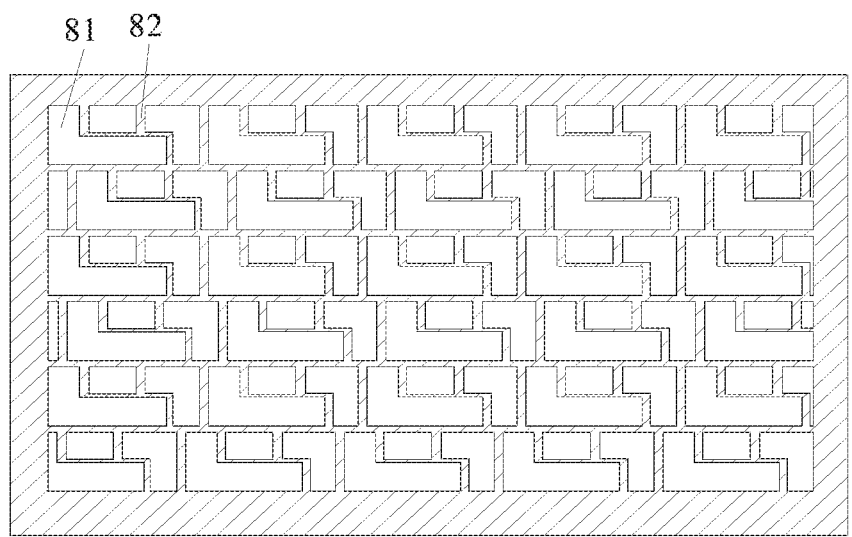
FIG. 7 is a schematic diagram of a mask that is used when forming a luminous layer according to another implementation.
Figure 8:
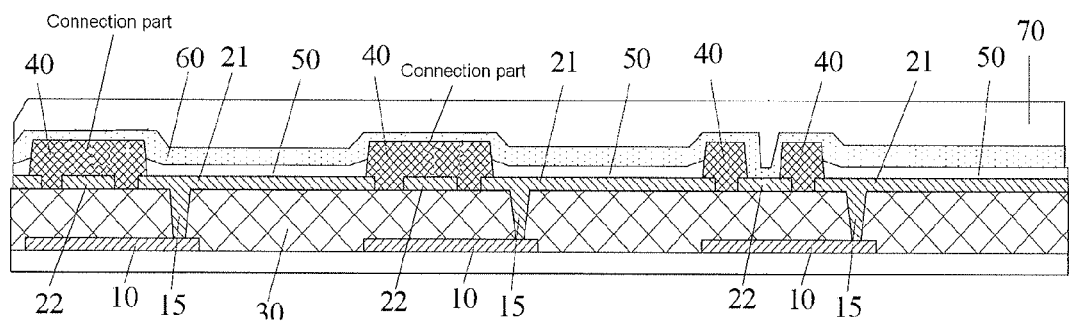
FIG. 8 is a schematic diagram of a substrate after encapsulation in an implementation of the present invention.

As another implementation of the present invention, the shapes of two anode regions at two sides of any assisting electrode 22 may be different. Thus, the shapes of the luminous regions corresponding to and above the two anode regions are different. FIG. 7 shows a schematic diagram of a mask for forming such display substrate. The mask includes opening parts 81 and a shielding part 82. The opening part 81 corresponds to the luminous element region and the shielding part 82 corresponds to the assisting electrode region. As shown in the drawing, the shapes of two opening part 81 at two sides of the assisting electrode may be different, and thus, the shapes of the luminous element regions at two sides of the assisting electrode may be different in the display substrate formed by using such mask. The advantage of using such mask is that it is possible to prevent the display panel from producing Mura defect when displaying.

A manufacturer can use the mask shown in FIG. 6 or the mask shown in FIG. 7 according to specific product requirements.

In the present invention, type of the display substrate is not specifically limited. For example, the display substrate may be a WOLED display substrate, and in such case, the display substrate further includes a plurality of spacers, which divide the display substrate into a plurality of pixel units. A portion of the spacer penetrates the anode layer and another portion of the spacer is located above the anode layer. That is, the spacer may be used as a pixel defining element.

It should be noted that the display substrate may be of a RGB separation mode. In such case, as sub-pixels of each color are individually manufactured, a mask for shielding the assisting electrode is no need to be manufactured additionally.

As a preferred implementation of the present invention, each of the assisting electrodes corresponds to one spacer, and the assisting electrodes are connected in a mesh shape. Insulation gaps are respectively formed at two sides of each of the assisting electrodes. Each spacer includes insertion parts that are respectively provided in the insulation gaps at two sides of the corresponding assisting electrode and a connection part for connecting two insertion parts. At least one insertion part is formed with a via for exposing the assisting electrode, and the cathode layer contacts the assisting electrode in parallel through the via. That is, the display substrate includes at least one via for connecting the assisting electrode and the cathode layer. As the plurality of assisting electrodes are connected in a mesh shape, the cathode layer of the display substrate can contact the assisting electrodes in parallel through only one via.

In this implementation, to avoid the Mura defect when displaying, preferably, the spacers define a plurality of regions and the shapes of adjacent two regions are different (i.e., the thus formed luminous regions have different shapes).

Preferably, as shown in FIG. 5, the luminous element array and the thin film transistor array can be provided with a planarization layer 30 therebetween, and the anode 21 is connected with the drain of the drive thin film transistor 10 by a via 15 penetrating through the planarization layer 30. It is easily to be understood that the display substrate may further include an encapsulation layer 70.

As another aspect of the present invention, there is provided a display panel, which includes a display substrate, wherein the display substrate is the above display substrate provided by the present invention.

As the display substrate is provided therein with the assisting electrode 22 that contacts the cathode layer 60 in parallel, and a resistance of a combined element formed by the cathode layer 60 and the assisting electrode 22 is smaller than a resistance of the cathode layer 60 alone, thus, when signals are provided to the display substrate, the IR drop in the combined element formed by the cathode layer 60 and the assisting electrode 22 is relatively small, such that a higher image quality of the display panel can be obtained.

The display panel may be used for electronic devices such as a television, a mobile phone and a tablet computer.

Figure 3:
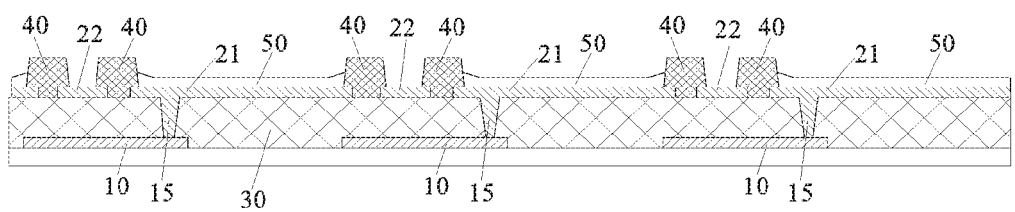
FIG. 3 is a schematic diagram of the substrate formed with a luminous layer.
Figure 4:
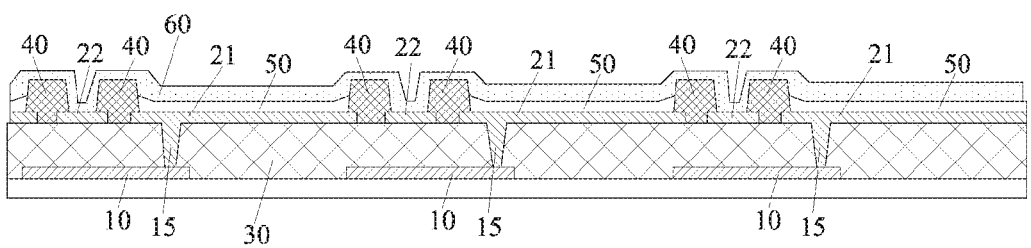
FIG. 4 is a schematic diagram of the substrate formed with a cathode layer.

As yet another aspect of the present invention, there is provided a manufacturing method of a display substrate, wherein the manufacturing method includes the following step of:

forming a luminous element array, and the step of forming the luminous element array includes:

forming an anode layer and at least one assisting electrode 22, the anode layer including a plurality of anodes 21 that are connected with drains of drive thin film transistors 10 in a one-to-one correspondence, the assisting electrode 22 being insulated and spaced from the anode 21 (as shown in FIG. 1);

forming a luminous layer (as shown in FIG. 3), the luminous layer including a plurality of luminous regions 50 corresponding to the plurality of anodes 21 in a one-to-one correspondence; and forming a cathode layer 60 (as shown in FIG. 4), the cathode layer 60 contacting the assisting electrode 22 in parallel, such that a total resistance of the assisting electrode 22 and the cathode layer 60 connected in parallel is smaller than a resistance of the cathode layer 60 alone.

As described above, as the display substrate is provided therein with the assisting electrode 22 that contacts the cathode layer 60 in parallel, and the resistance of the combined element formed by the cathode layer 60 and the assisting electrode 22 is smaller than the resistance of the cathode layer 60 alone, thus, when signals are provided to the display substrate, the IR drop in the combined element formed by the cathode layer 60 and the assisting electrode 22 is relatively small, such that a higher image quality of the display panel can be obtained.

Those skilled in the art should be understood that the manufacturing method further includes a step of forming a thin film transistor array before forming the luminous element array, wherein the thin film transistor array includes a plurality of drive thin film transistors. In the present invention, the specific method of forming the thin film transistor array is not specifically limited, as long as the drive thin film transistors for driving the luminous element array can be formed.

In the present invention, the specific process for forming the cathode layer 60 is also not specifically limited. For example, the cathode layer 60 may be formed through evaporation or sputtering.

To simplify steps of the manufacturing method, preferably, the step of forming the anode layer and the at least one assisting electrode 22 includes providing the anode layer and the at least one assisting electrode 22 in a same layer.

Specifically, the step of forming the anode layer and the at least one assisting electrode may include:

forming an anode material layer; and forming a plurality of anode regions and a plurality of assisting electrode regions from the anode material layer, an insulation gap being formed between the assisting electrode region and the anode region adjacent to the assisting electrode region, at least one anode being included within each anode region, and the plurality of assisting electrodes being connected in a mesh shape.

Figure 2:
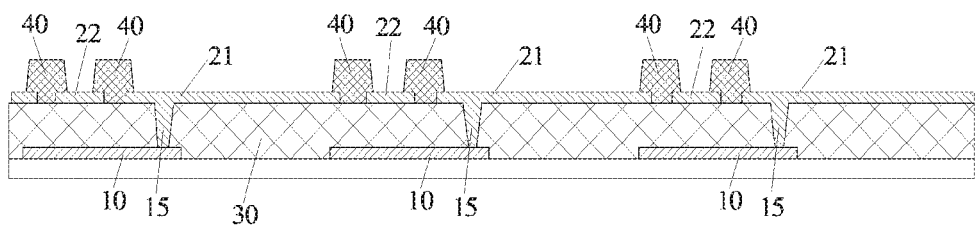
FIG. 2 is a schematic diagram of the substrate formed with spacers.

To ensure that the assisting electrode 22 and the anode 21 are reliably insulated and spaced, preferably, between the step of forming the anode layer and the at least one assisting electrode and the step of forming the luminous layer, the manufacturing method further includes:

forming spacers 40 (as shown in FIG. 2), a portion of the spacer 40 being provided within the insulation gap between the anode 21 and the assisting electrode 22, and another portion of the spacer 40 protruding from the anode layer.

Accordingly, in the step of forming the cathode layer, a material used for forming the cathode layer is deposited within a gap between a pair of spacers, which have the assisting electrode formed therebtween, such that the cathode layer connects with the assisting electrode in parallel.

The spacer 40 may be made of any insulation material. For example, the spacer 40 may be made of silicon oxide ($SiO_x$) or silicon nitride ($SiN_x$).

It is easily to be understood that the spacer 40 is also formed through a patterning process. Specifically, the step of forming the spacers may include:

forming a layer of insulation material film above the anode layer;

forming a layer of photoresist on the insulation material film;

exposing and developing the photoresist, so as to form a pattern corresponding to the spacers in the photoresist; and etching the insulation material film by using the exposed and developed photoresist as a mask, so as to form the spacers.

Obviously, the spacer 40 may be formed by using other methods, details of which will not be described herein.

Preferably, the step of forming the luminous layer may include:

disposing a mask (as shown in FIG. 6 and FIG. 7) above a base substrate formed thereon with the anode layer, wherein the mask includes a plurality of opening parts 81 corresponding to the plurality of anode regions and a shielding part 82 corresponding to the at least one assisting electrode; and evaporating a material used for forming the luminous layer, so as to form the plurality of luminous regions above the plurality of anode regions by deposition.

It is easily to be understood that "a base substrate formed thereon with the anode layer" does not mean the base substrate is formed with the anode layer only, but means the base substrate is formed with other structures (e.g., the planarization layer 30, the thin film transistor array, etc), in addition to the anode layer.

The formed structure of the anode layer may be two ITO layers with a material having a good reflectivity sandwiched therebetween, such as any of aluminum, silver, gold, titanium, molybdenum, or an alloy of any of them.

As described above, the assisting electrode 22 may be provided around the anode 21.

As an implementation of the present invention, a plurality rows and columns of anodes 21 may be provided. Anodes arranged in a matrix form may be formed by using the mask as shown in FIG. 6. This mask has a simple structure and low total cost.

As another implementation of the present invention, the shapes of two anode regions at two sides of the assisting electrode may be different. Thus, the shapes of two corresponding luminous regions 50 are different. The above luminous regions may be formed by using the mask as shown in FIG. 7. When a display substrate formed through the mask is used in display of a display panel, Mura defect will be less.

As described above, the thin film transistor array and the luminous element array may be provided with a planarization layer 30 therebetween. Thus, preferably, between the step of forming the thin film transistor array and the step of forming the luminous element array, the manufacturing method further includes steps of:

forming a planarization material layer; and forming a via penetrating through the planarization material layer, the via being located above the drain of the drive thin film transistor 10; wherein, in the step of forming the anode layer, a material used for forming the anode layer is filled within the via, such that the anode is connected with the drain of the drive thin film transistor 10 through the via.

After the cathode layer 60 is formed, the manufacturing method may further include a step of:

forming an encapsulation layer 70.

As described above, when the display substrate is a WOLED display substrate, the display substrate may further include a spacer as a pixel defining element. In this case, the step of forming the anode layer and the at least one assisting electrode includes:

forming an anode material layer;

forming a plurality of insulation gaps penetrating through the anode material layer, so as to divide the anode material layer into a plurality of pixel units; and the manufacturing method further includes:

forming a pattern including the spacer, a portion of the spacer being located within the insulation gap and another portion of the spacer being located above the anode layer.

Further, at least one of the plurality of insulation gaps includes a first gap and a second gap, and the assisting electrode is formed between the first gap and the second gap. The spacer corresponding to the assisting electrode includes insertion parts that are respectively provided in the insulation gaps at two sides of the assisting electrode and a connection part for connecting two insertion parts;

the manufacturing method further includes a step of forming a via for exposing the assisting electrode in the connection part between the step of forming the luminous layer and the step of forming the cathode layer; and the step of forming the cathode layer includes depositing a material used for forming the cathode layer in the via, such that the cathode layer contacts the assisting electrode in parallel.

Also, the luminous layer can be formed through a mask evaporation method. Specifically, the step of forming the luminous layer includes:

disposing a mask above a base substrate formed thereon with the anode layer, wherein the mask includes a plurality of opening parts and a plurality of shielding parts for spacing the plurality of opening parts, the shielding part corresponds to the assisting electrode; and evaporating a material used for forming the luminous layer, so as to form the luminous region above a position corresponding to the opening part by deposition.

To prevent Mura defect when displaying, preferably, the spacer defines a plurality of regions and the shapes of two adjacent regions are different, the luminous region being formed within the region.

As still another aspect of the present invention, there is provided a mask, which is used in the manufacturing method provided by the present invention, wherein, as shown in FIG. 6 and FIG. 7, the mask includes a plurality of opening parts 81 and a shielding part 82 corresponding to the at least one assisting electrode. As shown in the figures, the shielding part 82 is used for spacing the adjacent opening parts 81.

It should be understood that the mask may be used merely in the step of forming the luminous layer by using an evaporation method.

It can be understood that the foregoing implementations are merely exemplary embodiments used for explaining the principles of the present invention, but the present invention is not limited thereto. Various modifications and improvements can be made by those skilled in the art without departing from the spirit and essence of the present invention, and those modifications and improvements shall also be regarded as the protection scope of the present invention.

What is claimed is:

1. A display substrate, which includes an anode layer, a cathode layer and a luminous layer that is provided between the anode layer and the cathode layer, the anode layer including a plurality of anodes and the luminous layer including a plurality of luminous regions, wherein the display substrate further includes at least one assisting electrode, the at least one assisting electrode being insulated and spaced from the anodes, and the at least one assisting electrode contacting the cathode layer in parallel, such that a total resistance of the at least one assisting electrode and the cathode layer connected in parallel is smaller than a resistance of the cathode layer alone, wherein the at least one assisting electrode and the anode layer are provided in a same layer, and the display substrate further includes a spacer, insulation gaps are respectively formed at two sides of the at least one assisting electrode, a portion of the spacer being provided within the corresponding insulation gap and another portion of the spacer protruding from the anode layer, so as to space and insulate the at least one assisting electrode and the plurality of anodes, wherein there are a plurality of pairs of spacers, and the plurality of pairs of spacers divide the display substrate into a plurality of anode regions and a plurality of assisting electrode regions, each of the anode regions being provided therein with at least one anode and luminous region, each of the assisting electrode regions being provided therein with at least one of the assisting electrodes, the assisting electrode region being provided around the anode regions, a width of the assisting electrode regions being smaller than a width of the anode regions, a portion of the cathode layer being located within gap between a pair of the spacers in the assisting electrode regions so as to electrically connect the cathode layer and the assisting electrodes, and wherein shapes of the luminous regions formed in two anode regions at two sides of the assisting electrode are different.

2. The display substrate according to claim 1, wherein the spacer includes a row spacer extending horizontally along the display substrate and a column spacer extending longitudinally along the display substrate.

3. A display panel, which includes the array substrate according to claim 1.

4. A display substrate, which includes an anode layer, a cathode layer and a luminous layer that is provided between the anode layer and the cathode layer, the anode layer including a plurality of anodes and the luminous layer including a plurality of luminous regions, wherein the display substrate further includes at least one assisting electrode, the at least one assisting electrode being insulated and spaced from the anodes, and the at least one assisting electrode contacting the cathode layer in parallel, such that a total resistance of the at least one assisting electrode and the cathode layer connected in parallel is smaller than a resistance of the cathode layer alone, wherein the at least one assisting electrode and the anode layer are provided in a same layer, and the display substrate further includes spacers that divide the display substrate into a plurality of pixel units, a portion of the spacers penetrating through the anode layer and another portion of the spacers being located above the anode layer, and wherein each of the assisting electrodes corresponds to one spacer, the assisting electrodes being connected in a mesh shape, insulation gaps being respectively formed at two sides of each of the assisting electrodes, each spacer including insertion parts being respectively provided within the insulation gaps at two sides of the corresponding assisting electrode and a connection part for connecting two insertion parts, the connection part of at least one spacer being provided with a via for exposing the assisting electrode, the cathode layer being connected with the assisting electrodes in parallel through the via.

5. The display substrate according to claim 4, wherein the spacers define a plurality of regions and shapes of two adjacent regions are different, the luminous region being formed within the region.

6. A display panel, which includes the array substrate according to claim 1.

7. A manufacturing method of a display substrate, which includes the following step of:
forming a luminous element array, and the step of forming the luminous element array including steps of:
forming an anode layer and at least one assisting electrode, the anode layer including a plurality of anodes, the at least one assisting electrode being insulated and spaced from the anodes;
forming a luminous layer, the luminous layer including a plurality of luminous regions; and
forming a cathode layer, the cathode layer contacting the at least one assisting electrode in parallel, such that a total resistance of the at least one assisting electrode and the cathode layer connected in parallel is smaller than a resistance of the cathode layer alone,
wherein the step of forming the anode layer and the at least one assisting electrode includes providing the anode layer and the at least one assisting electrode in a same layer,
wherein the step of forming the anode layer and the at least one assisting electrode includes steps of:
forming an anode material layer; and
forming a plurality of anode regions and a plurality of assisting electrode regions from the anode material layer, an insulation gap being formed between the at least one assisting electrode region and the anode region adjacent to the at least one assisting electrode region, at least one anode being included within each anode region, and the plurality of assisting electrodes being connected in a mesh shape;
between the step of forming the anode layer and the at least one assisting electrode and the step of forming the luminous layer, the manufacturing method further includes a step of:
forming a spacer within each insulation gap, a portion of the spacer being provided within the insulation gap and another portion of the spacer protruding from the anode layer; and
the step of forming the cathode layer includes depositing a material for forming the cathode layer within a gap between a pair of spacers, which have the at least one assisting electrode formed therebetween, such that the cathode layer connects with the at least one assisting electrode in parallel,
wherein the step of forming the luminous layer includes steps of:
disposing a mask above a base substrate formed thereon with the anode layer, wherein the mask includes a plurality of opening parts corresponding to the plurality of anode regions and a shielding part corresponding to the at least one assisting electrode; and
evaporating a material used for forming the luminous layer, so as to form the plurality of luminous regions above the plurality of anode regions by deposition,
wherein shapes of two anode regions at two sides of the assisting electrode are different, so that the luminous regions deposited within the two anode regions are different.

8. The manufacturing method according to claim 7, wherein the plurality of anode regions are arranged in rows and columns.

9. A mask, which is used in the manufacturing method according to claim 7, wherein the mask includes a plurality of opening parts and a shielding part corresponding to the at least one assisting electrode, the shielding part being used for spacing the adjacent opening parts.

10. A manufacturing method of a display substrate, which includes the following step of:
forming a luminous element array, and the step of forming the luminous element array including steps of:
forming an anode layer and at least one assisting electrode, the anode layer including a plurality of anodes, the at least one assisting electrode being insulated and spaced from the anodes;
forming a luminous layer, the luminous layer including a plurality of luminous regions; and
forming a cathode layer, the cathode layer contacting the at least one assisting electrode in parallel, such that a total resistance of the at least one assisting electrode and the cathode layer connected in parallel is smaller than a resistance of the cathode layer alone,
wherein the step of forming the anode layer and the at least one assisting electrode includes providing the anode layer and the at least one assisting electrode in a same layer,
wherein the step of forming the anode layer and the at least one assisting electrode includes steps of:
forming an anode material layer;
forming a plurality of insulation gaps penetrating through the anode material layer in the anode material layer, so as to divide the anode material layer into a plurality of pixel units; and
between the step of firming the anode layer and the at least one assisting electrode and the step of forming the luminous layer, the manufacturing method further includes a step of:
forming a pattern including a spacer, a portion of the spacer being located within the insulation gap and the other portion of the spacer being located above the anode layer,
wherein at least one of the plurality of insulation gaps includes a first gap and a second gap, the at least one assisting electrode being formed between the first gap and the second gap, the spacer corresponding to the at least one assisting electrode including insertion parts that are respectively provided in the insulation gaps at two sides of the at least one assisting electrode and a connection part for connecting two insertion parts;
the manufacturing method further includes a step of forming a via for exposing the at least one assisting electrode in the connection part between the step of forming the luminous layer and the step of forming the cathode layer; and the step of forming the cathode layer includes depositing a material used for forming the cathode layer in the via, such that the cathode layer connects with the at least one assisting electrode in parallel.

11. The manufacturing method according to claim 10, wherein the step of forming the luminous layer includes:

disposing a mask above a base substrate formed thereon with the anode layer, wherein the mask includes a plurality of opening parts and a plurality of shielding parts for spacing the plurality of opening parts, the shielding part corresponds to the at least one assisting electrode; and evaporating a material used for forming the luminous layer, so as to form the luminous region above a position corresponding to the opening part by deposition.

12. The manufacturing method according to claim 10, wherein the spacers define a plurality of regions and the shapes of two adjacent regions are different, the luminous region being formed within the region.

\* \* \* \* \*